United States Patent [19]
Henningsson et al.

[11] Patent Number: 5,934,915
[45] Date of Patent: Aug. 10, 1999

[54] GROUNDING AND SCREENING DEVICE

[75] Inventors: Uno Henningsson, Klingvägen; Mats Rönnberg, Vaktbergsvägen, both of Sweden

[73] Assignee: Telefonaktiebolaget LM Ericsson, Stockholm, Sweden

[21] Appl. No.: 08/849,471

[22] PCT Filed: Dec. 14, 1995

[86] PCT No.: PCT/SE95/01507

§ 371 Date: Jun. 10, 1997

§ 102(e) Date: Jun. 10, 1997

[87] PCT Pub. No.: WO96/19098

PCT Pub. Date: Jun. 20, 1996

[30] Foreign Application Priority Data

Dec. 14, 1994 [SE] Sweden .................................. 9404360

[51] Int. Cl.⁶ ....................................................... H01R 4/66
[52] U.S. Cl. .......................... 439/92; 361/818; 174/35 R
[58] Field of Search ................................ 439/92, 108, 61, 439/607, 96; 361/818, 816, 800; 174/35 R, 35 GC

[56] References Cited

U.S. PATENT DOCUMENTS

| | | | |
|---|---|---|---|
| 4,554,400 | 11/1985 | Schmalzl | 361/818 |
| 4,631,641 | 12/1986 | Brombal et al. | 361/818 |
| 4,640,979 | 2/1987 | Schmalzl | 361/818 |
| 5,083,239 | 1/1992 | Sedlemeier et al. | 361/816 |
| 5,138,529 | 8/1992 | Colton et al. | 439/95 |
| 5,225,629 | 7/1993 | Garrett | 361/818 |
| 5,233,507 | 8/1993 | Günther et al. | 439/607 |
| 5,746,326 | 5/1998 | Hong | 361/800 |

FOREIGN PATENT DOCUMENTS

| | | |
|---|---|---|
| 0 424 806A2 | 5/1991 | European Pat. Off. . |
| 0 424 806A3 | 5/1991 | European Pat. Off. . |
| 0 517 135A1 | 12/1992 | European Pat. Off. . |
| 1275798A1 | 12/1986 | U.S.S.R. . |
| 92/17046 | 10/1992 | WIPO . |
| WO94/30035 | 12/1994 | WIPO . |

OTHER PUBLICATIONS

Karl Brand, Standard på väg för EMC–skyddande skåp och lådor, Elektroniktidningen, No. 8, Sep. 1992, pp. 30–31.

Sarel's subrack demonstrates EMC capability, Electronic Engineering, vol. 64, No. 789, Sep. 1992, p. 19.

*Primary Examiner*—Paula Bradley
*Assistant Examiner*—Tho D. Ta
*Attorney, Agent, or Firm*—Burns, Doane,Swecker & Mathis, L.L.P.

[57] ABSTRACT

A device for earth-connecting a first printed circuit board and an associated first board front with multiple printed circuit boards and associated board fronts in a magazine includes a board spring for each printed circuit board. The board spring is mounted on the printed circuit board and extends from an edge of the printed circuit board in a general U-shape into resilient abutment with the board front associated with the printed circuit board. Each board front has a generally U-shaped profile and is mounted on the associated printed circuit board with its legs parallel with and directed towards the associated printed circuit board. A shielding spring embraces one of the legs of the board front and extends along a whole of the board front, such as to clamp a free edge of the leg. The shielding spring is bent away from an outer side of the leg at a small angle so that when the first board front is inserted into the magazine, an outer portion of the shielding spring will contact another board front adjacent to the first board front, thereby making an earth connection between the first board front and the adjacent board front. In this way earth connections between all of the board fronts in the magazine are formed.

6 Claims, 4 Drawing Sheets

GROUNDING AND SCREENING DEVICE

TECHNICAL FIELD

The present invention relates to a device for earth-connecting a printed circuit board fitted with a board front, and also earth-connecting the board front to an adjacent board front in a magazine which contains a plurality of printed circuit boards in side-by-side relationship, in a manner to achieve electromagnetic compatibility (EMC-shielding), wherein the board front is comprised of a generally U-shaped profile and is mounted on the printed circuit board with the legs of the profile extending parallel with and extending towards the board.

DESCRIPTION OF THE BACKGROUND ART

It is often necessary to shield electronic components in telecommunications systems against ambient electromagnetic radiation so that the components will not be affected by external disturbance and so that radiation emanating from the electronic components themselves will not have a disturbing influence on other parts of the equipment in which they are included. The need to shield electronic components is particularly manifest in the case of printed circuit boards that are positioned side-by-side in a magazine, as a result of the narrow spacing between adjacent boards. It is also important to earth the boards effectively to their respective fronts and to the magazine. Several different solutions have been proposed to this end. None of these solutions, however, satisfactorily solves the problem of shielding and earthing electronic components in a simple, inexpensive and labor-saving manner.

SUMMARY OF THE INVENTION

The object of the present invention is to eliminate the drawbacks of earlier proposed solutions and to provide a low-cost device which can be quickly fitted readily and which will solve the problem of combining earthing and shielding of printed circuit boards housed in a printed circuit board magazine. This object is achieved with a device having the characteristic features set forth in the following claims.

The inventive device is a particularly simple and effective means for shielding and earthing printed circuit boards, and can be easily produced and fitted and is readily handled.

The invention will now be described in more detail with reference to a preferred embodiment thereof and also with reference to the accompanying drawings.

DETAILED DESCRIPTION OF PREFERRED EMBODIMENTS

Figure 1:
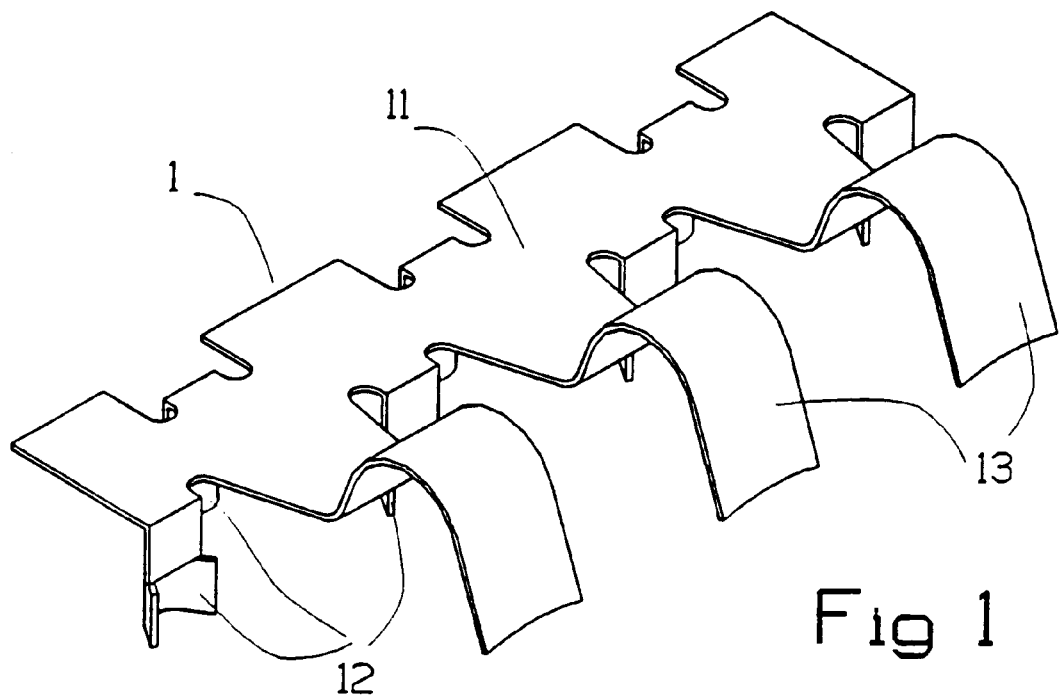
FIG. 1 is a perspective view of a board spring included in an inventive device.
Figure 2:
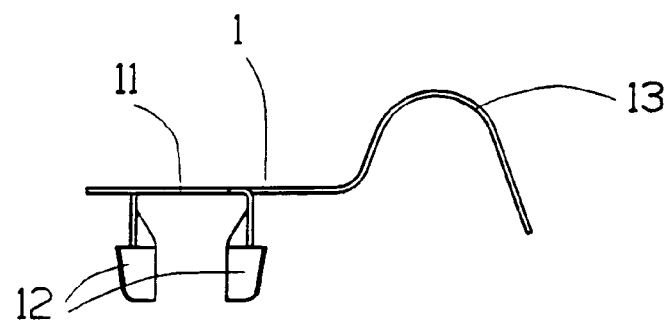
FIG. 2 is a sectional view of the spring shown in FIG. 1.

FIGS. 1 and 2 show a board spring 1 included in an inventive device, in perspective and in section respectively. The board spring 1 is intended to be fitted to a printed circuit board 2 so as to earth-connect the board with a generally U-shaped board front 3, as will be described in more detail below with reference to FIGS. 5 and 8. The board spring 1 is comprised of a generally flat plate 11 having downwardly extending legs 12 which function to engage in corresponding openings 21 in the printed circuit board 2 (see FIG. 8) such as to secure the board spring 1. The legs 12 may vary in configuration and do not form any part of the present invention. One side of the board spring 1 is provided with resilient, generally U-shaped tongues 13 which when mounting the board front 3 onto the printed circuit board 2 resiliently abut the board front and therewith earth the same.

Figure 3:
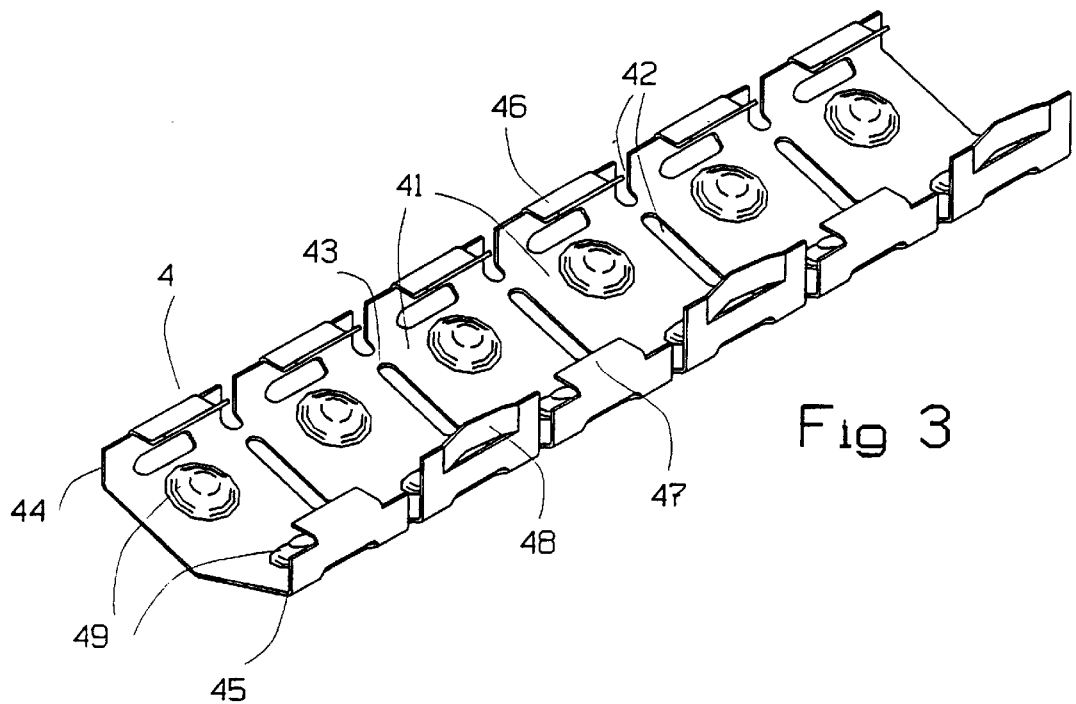
FIG. 3 is a perspective view of a shielding spring included in an inventive device.
Figure 4:
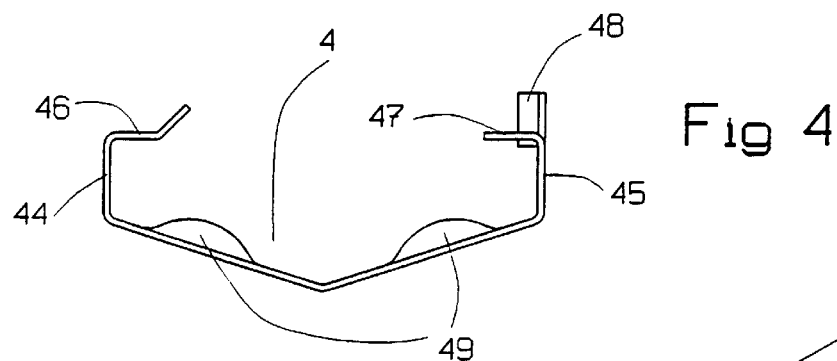
FIG. 4 is a sectional view of the spring shown in FIG. 3.

The inventive device also includes a shielding spring 4, which is shown respectively in perspective and in section in FIGS. 3 and 4. The shielding spring 4 is intended to be fitted to the U-shaped board front 3 and to earth the board front with an adjacent board front in a magazine, as described in more detail below with reference to FIGS. 5 and 8, and therewith shield the associated printed circuit board 3 from the surroundings. The shielding spring 4 is comprised of a generally U-shaped profile which is produced in long lengths and then cut into lengths appropriate for fitting the springs to respective board fronts 3. The profile is comprised of sections 41 which are delimited by apertures 42 punched in the profile, such that adjacent sections will be joined together solely by narrow bridges 43. (Only one bridge between each section can be seen in FIG. 3.) The profile can be easily broken or likewise separated into suitable lengths in the region of its bridges. Each section includes legs 44 and 45, wherein an inwardly bent tongue 46 is provided on the leg 44 of each section 41 and a corresponding inwardly bent tongue 47 is provided on the leg 45 of each alternate section, wherein the leg 45 of remaining sections is extended upwards and configured as an inwardly arched, resilient wall 48. The legs 44 and 45 with tongues 46 and 47 are intended to embrace one leg 31 of the board front 3 (see FIG. 8).

The bottom of the shielding spring profile 4 extends generally parallel with the leg 31 of the board front, but is bent slightly outwards and downwards in the Figures, so that the profile will be able to spring in against the leg 31 as the board front 3 and associated printed circuit board 2 are inserted into a magazine by the side of an earlier inserted board. In order to take-up the forces that are generated when the board is inserted into the magazine, and in order to prevent undue deformation of the shielding spring profile 4, the bottom of the profile is provided in each section with inwardly extending projections 49 which lie against the leg 31 of the board front. The projections 49 thus form contact points with the board-front profile 3, whereby the force exerted by an adjacent board front on the bottom of the shielding spring profile will be distributed to said projections.

It will be understood that the illustrated angles between the bent parts of the shielding spring 4 in the bottom of the profile have been greatly exaggerated for the sake of illustration. In reality, these angles are very small so as to prevent large forces in the board insertion direction, i.e. horizontal in the Figure, being transmitted to the shielding spring as the circuit board 2 is inserted into a magazine by the side of another circuit board.

Figure 5:
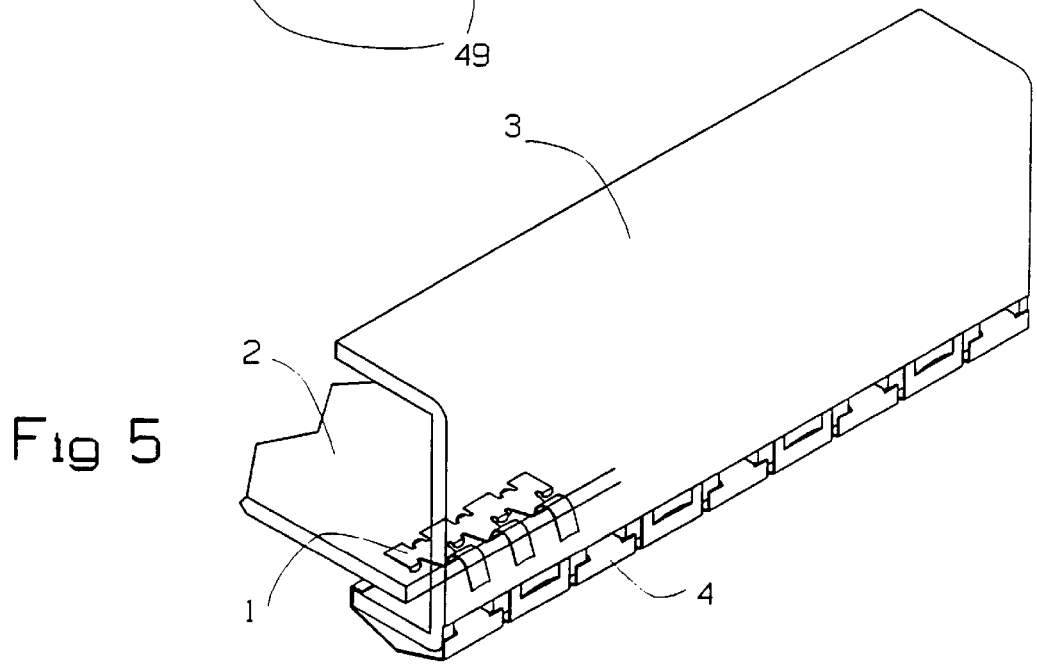
FIG. 5 is a perspective front view of a board spring and a shielding spring mounted on a printed circuit board to which a board front has been fitted.
Figure 6:
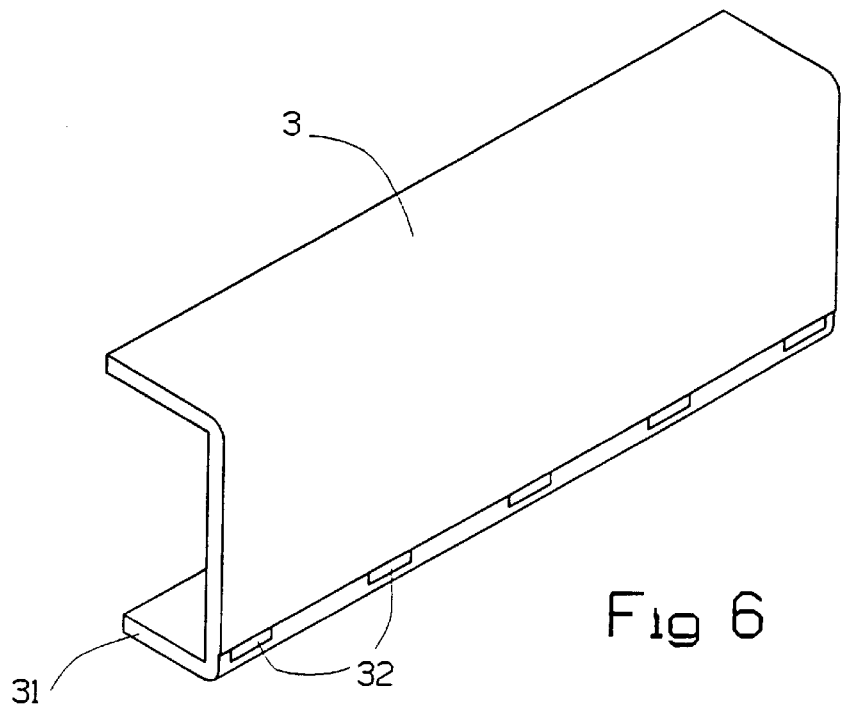
FIG. 6 is a perspective front view of a board front.

FIG. 5 shows a printed circuit board 2 fitted to a board front 3 and also shows associated board springs 1 (only one spring is shown) and shielding springs 4. The number of board springs 1 used will depend on the length of the printed circuit board. The board springs 1 are secured on the printed circuit board 2 by means of legs 12 which are received in the openings 21, wherein the tongues 13 resiliently abut the board front 3 and therewith ensure that an earth connection is established between the earth plane of the board 2 and the board front. As before mentioned, the shielding spring 4 is manufactured in long lengths and thereafter cut to suitable lengths and fitted onto the board front 3 so that the tongues 46 and 47 will grip around the leg 31 in the board front. The shielding spring 4 is guided longitudinally along the board front 3 by virtue of the fact that the leg 31 embraced by the spring 4 is provided in the region of the junction of the leg and the bottom of the board-front profile with openings 32 into which the tongues 47 engage, as shown in FIG. 6.

Figure 7:
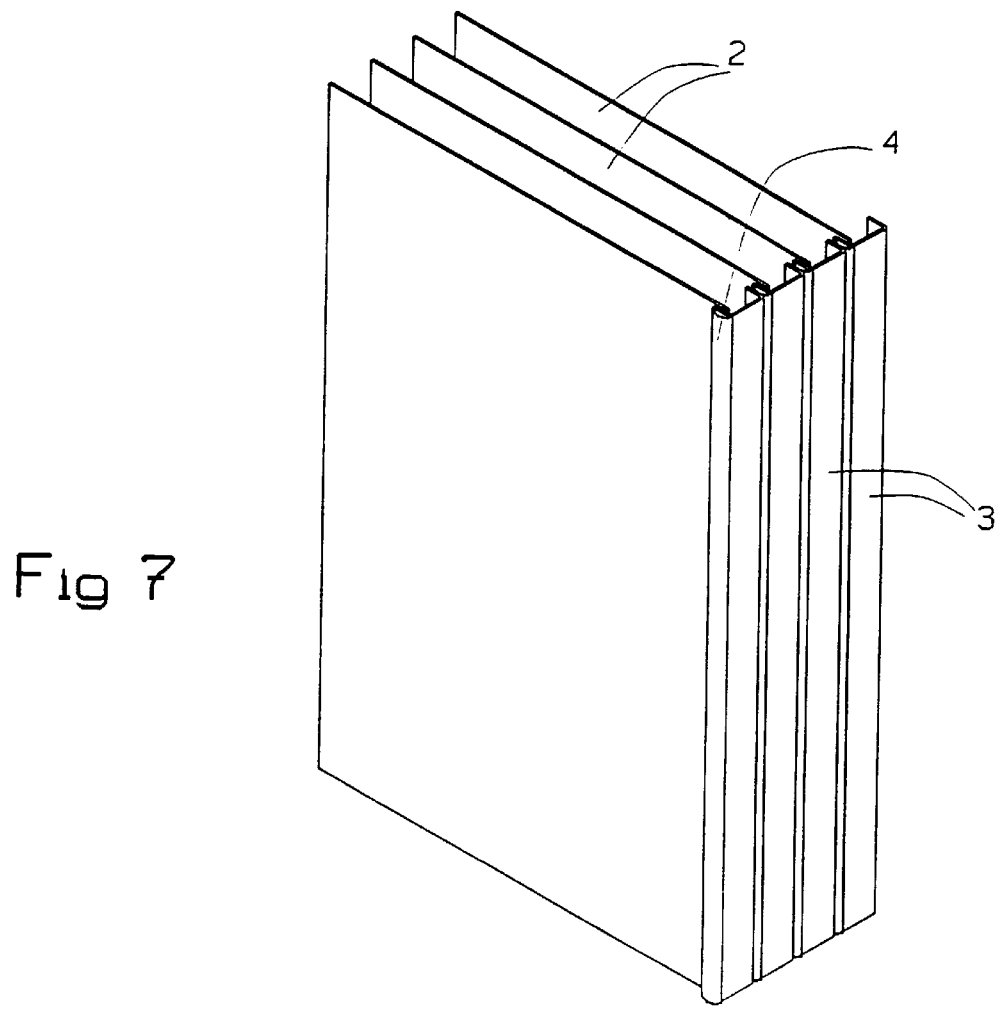
FIG. 7 illustrates schematically a plurality of printed circuit boards placed side-by-side in an imagined magazine.

FIG. 7 illustrates schematically a plurality of printed circuit boards 2 and associated board fronts 3 and shielding springs 4 inserted side-by-side in a magazine, not shown. The shielding spring 4 therewith forms an effective EMC shield for the board 2 when the board 2 is inserted in the magazine.

Figure 8:
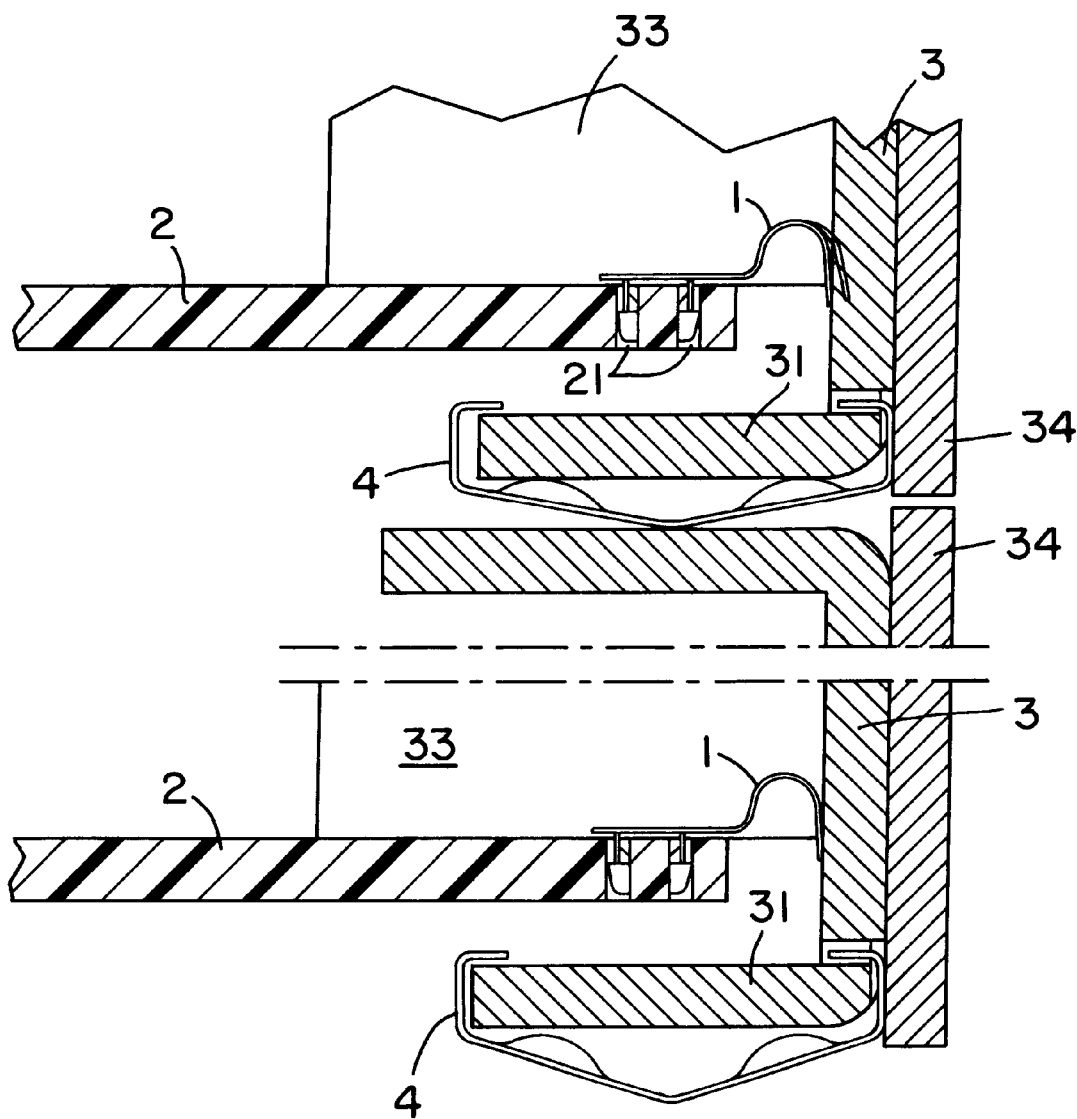
FIG. 8 is a sectional view illustrating the board spring and the shielding spring and the deformation of said springs upon respective contact with the printed circuit board and the adjacent board front.

FIG. 8 shows from above (in FIG. 7) two mutually adjacent printed circuit boards 2 with associated board fronts 3, board springs 1 and shielding springs 4, and shows how the board spring 1 and the shielding spring 4 are therewith deformed and activated, wherein the upper part of the Figure shows the board spring in an inactive position in broken lines and the deformed spring in full lines. When fitting the board front 3 to the board 2, the tongues 13 are deformed and pressed in against the board front 3. The board printed circuit board 2 may be fitted to the board front 3 by screwing the board 2 to a projection 33 provided on the board front.

The upper part of FIG. 8 also shows the shielding spring 4 in a deformed state, and it will be seen that when inserting an adjacent board front the left-hand part of the shielding spring (as seen in the Figure) will be moved to the left and rub against respective surfaces and therewith ensure electrical contact, earth connection, therewith. The projection 49 takes-up those forces that are exerted perpendicular to the leg 31 and, at the same time, guides the shielding spring laterally, as a result of its abutment with the leg on the board front. It will be understood that each shielding spring section is individually resilient and that the transmitted forces are distributed on the projection 49 in two rows of contact points along the whole of the shielding spring. FIG. 8 also shows a front plate 34 fitted to the board front 3 and functioning to lock the shielding spring 4 against the board front.

As a result of its resilient abutment with the board front, the board spring 1 provides an effective and positive earth connection between printed circuit board 2 and board front 3. As a result of its resilient abutment with its own board front 3 and with the board front of an adjacent printed circuit board, the shielding spring 4 will also provide an effective and positive earth connection, each section individually per se, between the board fronts, and therewith an earth connection to the magazine, while providing an effective and positive shield between circuit board and board front.

It will be understood that the invention is not restricted to the aforedescribed and illustrated exemplifying embodiments thereof and that modifications can be made within the scope of the following claims.

We claim:

1. A device for earth-connecting a printed circuit board and an associated board front so as to achieve an electromagnetic compatibility effect, and for earth-connecting the board front with an adjacent board front in a magazine that contains a plurality of printed circuit boards side-by-side such as to achieve an electromagnetic compatibility effect, wherein the board front is comprised of a generally U-shaped profile and is mounted on the printed circuit board with its legs parallel with and directed towards the printed circuit board, characterized in that the device includes a board spring which is mounted on the printed circuit board and which extends from an edge of said printed circuit board in a generally U-shape into resilient abutment with the board front, and a shielding spring which embraces one of said legs on the board-front profile and extends along a whole of the board front, such as to clamp a free edge of said leg on the board-front profile, wherein the shielding spring is bent away from an outer side of the leg on the board-front profile at a small angle such as to abut the adjacent board front while clamping said leg on the board-front profile, wherein when the board front is fitted to the printed circuit board the board front will press against the board spring and therewith make an earth connection between the printed circuit board and the board front, and wherein as the printed circuit board is inserted into the magazine an adjacent board front will press against the shielding spring on the outside of the leg on the board-front profile and therewith make the earth connection between the board fronts.

2. A device according to claim 1, characterized in that the board spring has a flat part which abuts the printed circuit board and which has outwardly projecting legs that engage in corresponding openings in the printed circuit board and make an earth connection with an earth plane of said printed circuit board.

3. A device according to claim 1, characterized in that the board front has openings at a junction of the leg and a bottom of the board-front profile.

4. A device according to claim 3, characterized in that the shielding spring has inwardly angled tongues which grip around the free edge of the board-front leg and also in the openings in said board front.

5. A device according to claim 4, characterized in that the shielding spring is provided in those parts angled from the board-front leg with projections that lie in abutment with said board-front leg and that function to take-up those forces that are generated when inserting the printed circuit board into the magazine by the side of an adjacent one of the plurality of circuit boards.

6. A device according to claim 5, characterized in that the angles to which the shielding springs are bent are sufficiently small to prevent any appreciable forces acting on the shielding springs in the insertion direction as the printed circuit board and associated board front are inserted into the magazine by the side of the adjacent printed circuit board and its associated board front.

* * * * *